United States Patent
Yang et al.

(10) Patent No.: US 8,617,984 B2
(45) Date of Patent: Dec. 31, 2013

(54) TUNGSTEN METALLIZATION: STRUCTURE AND FABRICATION OF SAME

(71) Applicant: International Business Machines Corporation, Armonk, NY (US)

(72) Inventors: Chih-Chao Yang, Glenmont, NY (US); Daniel C. Edelstein, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/765,576

(22) Filed: Feb. 12, 2013

(65) Prior Publication Data

US 2013/0149859 A1    Jun. 13, 2013

Related U.S. Application Data

(62) Division of application No. 13/211,722, filed on Aug. 17, 2011.

(51) Int. Cl.
*H01L 23/522* (2006.01)

(52) U.S. Cl.
USPC ............... 438/643; 257/753; 257/E23.017; 257/763; 257/764; 257/E23.163; 257/E21.584; 438/648

(58) Field of Classification Search
USPC .......... 257/751, 753, E23.017, E21.159, 763, 257/764, E23.163, E21.584; 438/643, 648, 438/627, 652–654
See application file for complete search history.

(56) References Cited

U.S. PATENT DOCUMENTS

| | | | |
|---|---|---|---|
| 6,242,349 B1 | 6/2001 | Nogami et al. | |
| 6,455,937 B1 | 9/2002 | Cunningham | |
| 6,869,850 B1 | 3/2005 | Blosse et al. | |
| 7,149,137 B2 | 12/2006 | Rodriguez et al. | |
| 7,220,665 B2 | 5/2007 | Farrar | |
| 7,535,103 B2 * | 5/2009 | Farrar | 257/750 |
| 7,695,981 B2 | 4/2010 | Dai et al. | |
| 7,812,455 B2 | 10/2010 | King et al. | |
| 2010/0149625 A1 | 6/2010 | Lu et al. | |
| 2010/0308380 A1 | 12/2010 | Rothwell et al. | |
| 2011/0175228 A1 * | 7/2011 | Lazovsky et al. | 257/768 |

* cited by examiner

*Primary Examiner* — Stephen W Smoot
*Assistant Examiner* — Edward Chin
(74) *Attorney, Agent, or Firm* — Scully, Scott, Murphy & Presser, P.C.; Catherine Ivers, Esq.

(57) ABSTRACT

A local interconnect structure is provided in which a tungsten region, i.e., tungsten stud, that is formed within a middle-of-the-line (MOL) dielectric material is not damaged and/or contaminated during a multiple interconnect patterning process. This is achieved in the present disclosure by forming a self-aligned tungsten nitride passivation layer within a topmost surface and upper sidewalls portions of the tungsten region that extend above a MOL dielectric material which includes a first interconnect pattern formed therein. During the formation of the self-aligned tungsten nitride passivation layer, a nitrogen enriched dielectric surface also forms within exposed surface of the MOL dielectric material. A second interconnect pattern is then formed adjacent to, but not connect with, the first interconnect pattern. Because of the presence of the self-aligned tungsten nitride passivation layer on the tungsten region, no damaging and/or contamination of the tungsten region can occur.

17 Claims, 4 Drawing Sheets

TUNGSTEN METALLIZATION: STRUCTURE AND FABRICATION OF SAME

CROSS REFERENCE TO RELATED APPLICATION

This application is a divisional of U.S. patent application Ser. No. 13/211,722, filed Aug. 17, 2011, the entire content and disclosure of which is incorporated herein by reference.

BACKGROUND

The present disclosure relates to a semiconductor structure and a method of forming the same. More particularly, the present disclosure relates to a local interconnect structure having a tungsten region whose topmost surface and upper sidewall portions are protected by a self-aligned tungsten nitride passivation layer. The present disclosure also provides a method of forming such a local interconnect structure.

Integrated circuits (ICs) typically include a plurality of semiconductor devices and overlying metal interconnect wiring. A local interconnect, which is sometimes referred to in the art as a Vo level, is typically present between the semiconductor devices and the overlying metal interconnect wiring. Local interconnects typical include a dielectric oxide having a contact via that is filled with tungsten or another like conductive material. During multiple interconnect pattern formation, the upper surface of the tungsten contact gets damaged and/or contaminated. Such damage and/or contamination to the conductive filled contact is undesirable and thus a scheme is needed to protect the exposed surfaces of the conductive filled contact during multiple interconnect patterning.

SUMMARY

A local interconnect structure is provided in which a tungsten region, i.e., tungsten stud, that is formed within a middle-of-the-line (MOL) dielectric material is not damaged and/or contaminated during a multiple interconnect patterning process. This is achieved in the present disclosure by forming a self-aligned tungsten nitride passivation layer within a topmost surface and upper sidewall portions of the tungsten region that extend above an MOL dielectric material which includes a first interconnect pattern formed therein. During the formation of the self-aligned tungsten nitride passivation layer, a nitrogen enriched dielectric surface layer also forms within exposed surfaces of the MOL dielectric material. A second interconnect pattern is then formed adjacent to, but not connect with, the first interconnect pattern.

Because of the presence of the self-aligned tungsten nitride passivation layer within the tungsten region, no damage and/or contamination of the tungsten region can occur. The formation of the nitrogen enrich dielectric surface layer within the MOL dielectric material is advantageous since it provides protection to the MOL dielectric material during further processing of the structure.

In one aspect of the present disclosure a semiconductor structure, i.e., a local interconnect structure, is provided. The local interconnect structure of the present disclosure includes a middle-of-the line (MOL) dielectric material having a tungsten region located therein. In the disclosed structure, a topmost surface and upper sidewall portions of the tungsten region have a self-aligned tungsten nitride passivation layer located therein. The disclosed structure further includes another dielectric material located atop the MOL dielectric material. The disclosed structure also includes a first interconnect pattern located within a portion of the another dielectric material and the MOL dielectric material. In accordance with the present disclosure, the first interconnect pattern exposes the self-aligned tungsten nitride passivation layer located within the topmost surface and upper sidewall portions of the tungsten region. Also, in accordance with the present disclosure, a nitrogen enriched dielectric surface layer is located within exposed surfaces of the another dielectric material and the MOL dielectric material that are located in the first interconnect pattern. The disclosed structure even further includes a second interconnect pattern located within another portion of the another dielectric material and the MOL dielectric material. At least a conductive material is located within both the first and second interconnect patterns of the disclosed structure.

In another aspect of the present disclosure, a method of forming such a local interconnect structure is provided. The method of the present disclosure includes forming a tungsten region within a middle-of-the-line (MOL) dielectric material. The tungsten region has a topmost surface that is coplanar with an upper surface of the MOL dielectric material. Another dielectric material is formed atop the MOL dielectric and the tungsten region, and then a first interconnect pattern is formed into one portion of the another dielectric material and the MOL dielectric material. In accordance with the present disclosure, upper sidewall portions of the tungsten region are exposed during the formation of the first interconnect pattern. A nitridation process is then performed providing a self-aligned tungsten nitride passivation layer within the topmost surface and upper sidewall portions of the tungsten region, and a nitrogen enriched dielectric surface layer within exposed surfaces of both the another dielectric material and the MOL dielectric material. After the nitridation process, a second interconnect pattern is formed into another portion of the another dielectric material and the MOL dielectric material, and thereafter remaining portions of the first interconnect pattern and second interconnect pattern are filled with at least a conductive material.

DETAILED DESCRIPTION

The present disclosure, which provides a local interconnect structure having a tungsten region whose topmost surface and upper sidewall portions are protected by a self-aligned tungsten nitride passivation layer and method of forming the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
FIG. 1 is a pictorial representation (through a cross sectional view) illustrating an initial structure including a middle-of-the line (MOL) dielectric material that can be employed in one embodiment of the present disclosure.

Referring first to FIG. 1, there is illustrated an initial structure 10 including a middle-of-the-line (MOL) dielectric material 12 that can be employed in one embodiment of the present disclosure. The initial structure 10 is located atop a substrate (not shown) which includes at least one active semiconductor device, such as, for example, a field effect transistor. In accordance with the present disclosure, the tungsten region to be subsequently formed is located atop a conductive region, e.g., gate conductor, of the at least one active semiconductor device.

In one embodiment of the present disclosure, the MOL dielectric material 12 can be composed of, for example, silicon dioxide, undoped silicate glass (USG), fluorosilicate glass (FSG), borophosphosilicate glass (BPSG), a spin-on low-k dielectric layer, or a chemical vapor deposition (CVD) low-k dielectric layer. The term "low-k" as used throughout the present disclosure denotes a dielectric material that has a dielectric constant of less than silicon dioxide. The MOL dielectric material 12 can be formed utilizing a conventional deposition process including, for example, chemical vapor deposition (CVD), plasma enhanced chemical vapor deposition (PECVD), evaporation and spin-on coating. The thickness of the MOL dielectric material 12 that can be employed in the present disclosure may vary depending on the type of MOL dielectric employed as well as the method that was employed in forming the same. In one embodiment, the MOL dielectric material 12 has a thickness from 80 nm to 500 nm. In another embodiment, the MOL dielectric material 12 has a thickness from 100 nm to 400 nm. Other thicknesses that are greater or lesser than the ranges provided above can also be used for the MOL dielectric material 12.

Figure 2:
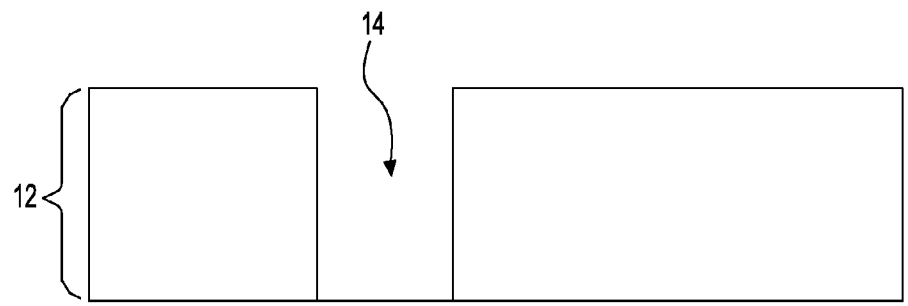
FIG. 2 is a pictorial representation (through a cross sectional view) illustrating the initial structure of FIG. 1 after forming a contact via opening within the MOL dielectric material.

Referring now to FIG. 2, there is illustrated the initial structure 10 of FIG. 1 after forming a contact via opening 14 within the MOL dielectric material 12. Although the drawings show the formation of a single contact via opening 14, a plurality of such contact via openings can be formed within the MOL dielectric material 12. In some embodiments, the contact via opening 14 exposes an upper surface of a gate conductor of a field effect transistor.

The contact via opening 14 is formed by lithography and etching. The lithography step includes applying a photoresist (not shown) atop the MOL dielectric material 12 utilizing a conventional deposition process such as, for example, CVD, PECVD, spin-on coating, chemical solution deposition or evaporation. The photoresist may be a positive-tone material, a negative-tone material or a hybrid material, each of which is well known to those skilled in the art. The photoresist is then subjected to a lithographic process which includes exposing the photoresist to a pattern of radiation and developing the exposed resist utilizing a conventional resist developer. The lithographic step provides a patterned photoresist atop the MOL dielectric material 12 that defines the width of the contact via opening to be subsequently formed into the MOL dielectric material 12. After providing the patterned photoresist, the pattern is transferred into the MOL dielectric material 12 utilizing one or more etching processes. The patterned photoresist can be stripped immediately after the pattern is transferred into the MOL dielectric material 12 utilizing a conventional stripping process. The etch used in transferring the pattern from the patterned resist into the MOL dielectric material 12 may comprise a dry etching process, a wet chemical etching process or a combination thereof. The term "dry etching" is used herein to denote an etching technique such as reactive-ion etching, ion beam etching, plasma etching or laser ablation.

In one embodiment of the present disclosure, the width of the contact via opening 14 that is formed, as measured from a first sidewall to an opposing sidewall, is typically from 10 nm to 200 nm. In another embodiment of the present disclosure, the width of the contact via opening 14 that is formed, as measured from a first sidewall to an opposing sidewall, is typically from 20 nm to 100 nm. Other widths for the contact via opening 14 that are greater or lesser than the ranges provided above can also be employed in the present disclosure.

Figure 3:
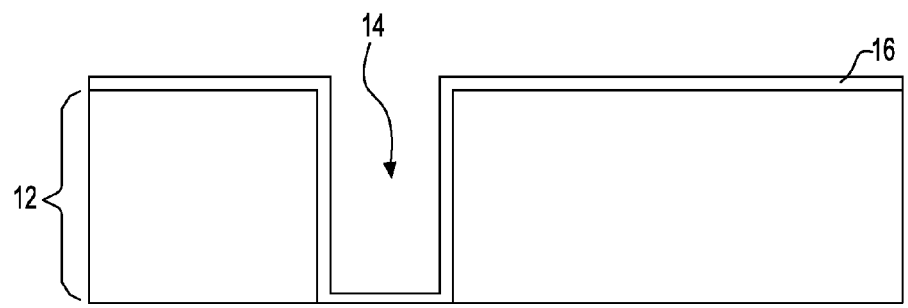
FIG. 3 is a pictorial representation (through a cross sectional view) illustrating the structure of FIG. 2 after forming a first diffusion barrier within the contact via opening.

Referring now to FIG. 3, there is illustrated the structure of FIG. 2 after forming a first diffusion barrier 16 within the contact via opening 14 as well as atop the MOL dielectric material 12. The first diffusion barrier 16 can comprise Ta, TaN, Ti, TiN, Ru, RuN, RuTa, RuTaN, W, WN or any other material that can serve as a barrier to prevent a conductive material from diffusing there through. Combinations of these materials can also be employed forming a multilayered stack diffusion barrier. The diffusion barrier 16 can be formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the first diffusion barrier 16 may vary depending on the number of material layers within the diffusion barrier, the technique used in forming the same as well as the material of the diffusion barrier itself. Typically, the first diffusion barrier 16 has a thickness from 2 nm to 40 nm, with a thickness from 5 nm to 20 nm being even more typical. Other thicknesses that are greater or lesser that the aforementioned thickness ranges can also be employed in the present disclosure.

Figure 4:
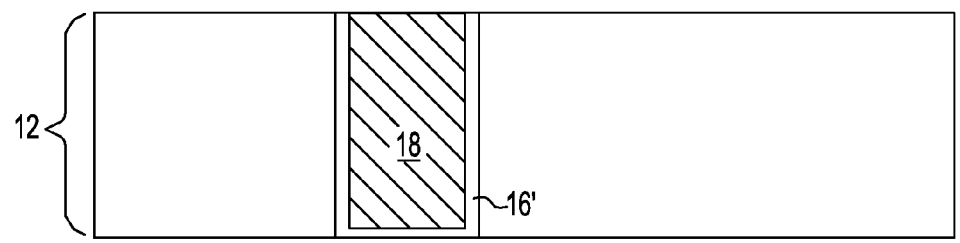
FIG. 4 is a pictorial representation (through a cross sectional view) illustrating the structure of FIG. 3 after forming a tungsten region within the remaining portions of the contact via opening and planarization.

Referring to FIG. 4, there is illustrated the structure of FIG. 3 after forming a tungsten region 18, i.e., tungsten plug, within the remaining portions of the contact via opening 14 and planarization. In one embodiment, the tungsten region 18 can be composed of only tungsten. In another embodiment, the tungsten region 18 can be composed of tungsten and at least one other metal (such as, for example, Al, Cu, Rh, Ru, Co, and Ir) and/or impurity (such as, for example, Co, P, and B). The tungsten region 18 can be formed by a deposition process including, for example, sputtering, plating, PECVD, CVD and physical vapor deposition (PVD).

After depositing the tungsten region 18, a planarization process is employed to provide the planar structure shown in FIG. 4. The planarization process that can be used in providing the planar structure shown in FIG. 4 includes, for example, chemical mechanical polishing and/or grinding. As shown in FIG. 4, the planarization process provides a planar structure in which an upper surface of tungsten region 18 is coplanar with an upper surface of the MOL dielectric material 12. Also, and as depicted in FIG. 4, the planar structure includes a U-shaped first diffusion barrier 16' having upper surfaces that are coplanar with both the upper surface of the tungsten region 18 and the upper surface of the MOL dielectric material 12.

Figure 5:
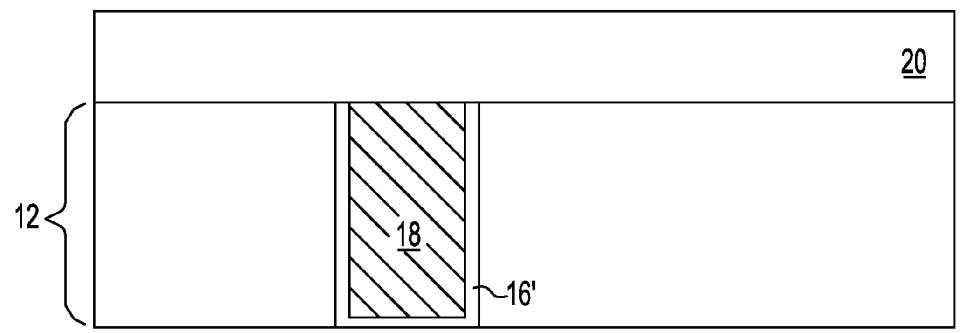
FIG. 5 is a pictorial representation (through a cross sectional view) illustrating the structure of FIG. 4 after forming another dielectric material atop the planarized structure.

Referring now to FIG. 5, there is illustrated the structure of FIG. 4 after forming another dielectric material 20 atop the planarized structure. That is, the another dielectric material 20 is formed atop the exposed upper surfaces of the MOL dielectric material 12, the U-shaped first diffusion barrier 16' and the tungsten region 18. In one embodiment, the another dielectric material 20 may comprise the same dielectric material as the MOL dielectric material 12. In another embodiment, the another dielectric material 20 is comprised of a different dielectric material as the MOL dielectric material 12. For example and in some embodiments of the present disclosure, the MOL dielectric material 12 can be composed of a dielectric oxide, while the another dielectric material 20 is composed of low-k dielectric material including, for example, a silsesquioxane, a C doped oxide (i.e., organosilicates) that include atoms of Si, C, O and H, a thermosetting polyarylene ether, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. In some embodiments, the another dielectric material 20 is non-porous. In yet other embodiments, the another dielectric material 20 is porous. By "porous" it is meant that the another dielectric material 20 has voids therein.

The another dielectric material 20, which is formed as a blanket layer atop the planar structure shown in FIG. 4, can be formed utilizing a deposition process including, for example, chemical vapor deposition (CVD), plasma enhanced chemical vapor deposition (PECVD), evaporation, chemical solution deposition and spin-on coating. The thickness of the another dielectric material 20 may vary depending upon the type of dielectric material used as well as the exact number of dielectrics within the layer. In one embodiment, the another dielectric material 20 has a thickness from 50 nm to 500 nm. In yet another embodiment, the another dielectric material 20 has a thickness from 100 nm to 400 nm. Other thicknesses that are greater than or less than the aforementioned ranges can also be employed as the thickness of the another dielectric material 20 in the present disclosure.

Figure 6:
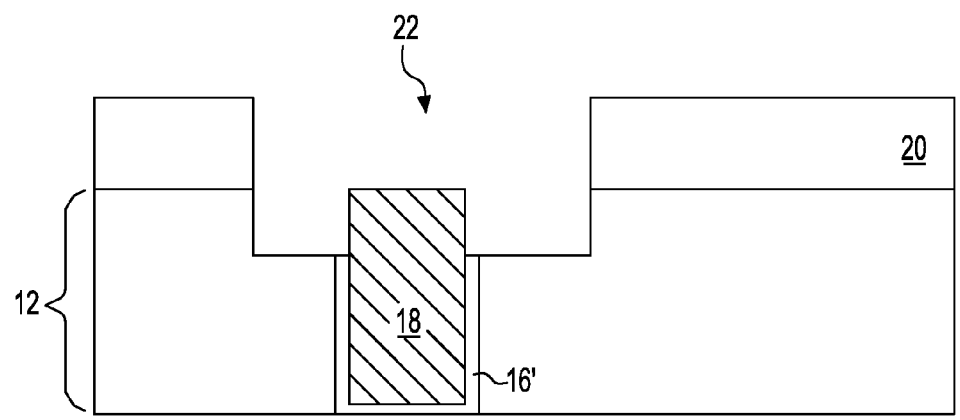
FIG. 6 is a pictorial representation (through a cross sectional view) illustrating the structure of FIG. 5 after forming a first interconnect pattern therein.

Referring now to FIG. 6, there is illustrated the structure of FIG. 5 after forming a first interconnect pattern 22 therein. The first interconnect pattern 22 is typically a line whose width is greater than the width of the contact via opening 14 mentioned above. The first interconnect pattern 22 can be formed utilizing the same technique (i.e., lithography and etching) as mentioned above in forming the contact via opening 14. As is shown in FIG. 6, the etching process forms the first interconnect pattern 22 into portions of the another dielectric material 20 and the MOL dielectric material 12. Also, and shown in FIG. 6, the etching process does not remove any portion of the tungsten region 18, however some portions of the U-shaped first diffusion barrier 16' are removed exposing upper sidewall portions of the tungsten region 18. As such, and at this point of the process, a topmost surface of the tungsten region 18 and upper sidewall portions of the tungsten region 18 are exposed.

It is noted that if a second interconnect pattern was now formed into the structure shown in FIG. 6, the exposed portions of the tungsten region 18 would be damaged and/or contaminated. Damaging and/or contaminating the exposed portions of the tungsten region 18 are not desired since the same may adversely affect the performance of the semiconductor structure. The damaged tungsten region will not only degrade electrical performance, but also degrade the circuit integrity and reliability. Furthermore, the damaged tungsten material could peel off from the patterned structure, and contaminate the processing tools.

Figure 7:
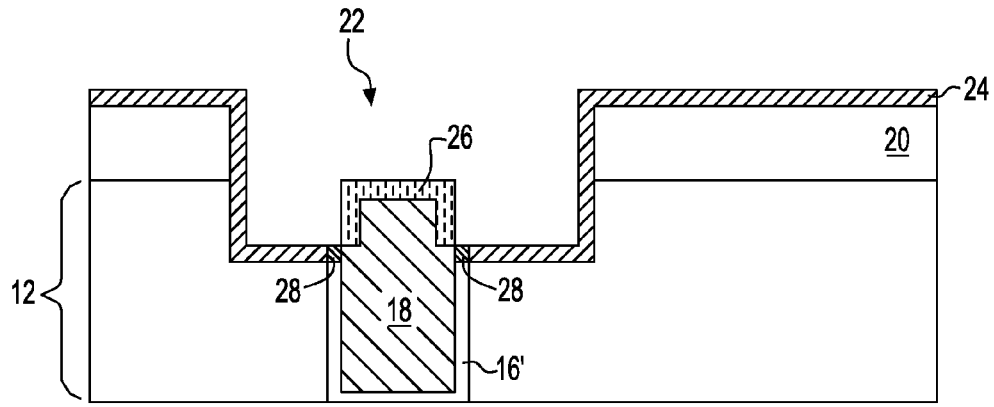
FIG. 7 is a pictorial representation (through a cross sectional view) illustrating the structure of FIG. 6 after performing a nitridation process.

To avoid damaging and/or contaminating the exposed portions of the tungsten region 18, a nitridation process is performed on the structure shown in FIG. 6 providing a structure such as is illustrated in FIG. 7. Specifically, FIG. 7 illustrates the structure of FIG. 6 after performing a nitridation process that forms a self-aligned tungsten nitride passivation layer 26, a nitrogen enriched dielectric surface layer 24, and a nitrogen enriched diffusion barrier layer 28. As shown, the nitrogen enriched diffusion barrier 28 is located between an end portion of the nitrogen enriched dielectric surface layer 24 and a sidewall of the tungsten region 18.

The self-aligned tungsten nitride passivation layer 26 is formed within the exposed portions of the tungsten region 18, i.e., within the exposed topmost surface of the tungsten region 18 and within the exposed upper sidewall portions of the tungsten region 18. The self-aligned tungsten nitride passivation layer 26 has a higher resistance to chemical attack during a subsequent etching/stripping process than the tungsten region 18, itself. As such, the self-aligned tungsten nitride passivation layer 26 protects the remaining tungsten region 18 from being damaged and/or contaminated during a subsequent etching/stripping process, e.g., used in forming the second interconnect pattern. The self-aligned tungsten nitride passivation layer 26 includes tungsten and nitrogen. The content of the nitrogen within the self-aligned tungsten nitride passivation layer 26 may vary so long as the passivation layer 26 can protect the remaining portions of the tungsten region 18 from chemical attack.

By "nitrogen enriched dielectric surface layer" it is meant that the exposed horizontal and vertical surfaces of both the another dielectric material 20 and the MOL dielectric material 12 have a higher nitrogen content therein after performing the nitridation process as compared to the originally deposited another dielectric material 20 and the MOL dielectric material 12. The nitrogen enriched dielectric surface layer 24 may also be referred to as a nitrided surface. The nitrogen content within the nitrided surface layer of the MOL dielectric material 12 may be the same or different from the nitrogen content within the nitrided surface layer of the another dielectric material 20. In one embodiment (and as shown in the drawings), the nitrogen enriched dielectric surface layer 24 can be composed of a single contiguous layer. In another embodiment (not shown in the drawings), the nitrogen enriched dielectric surface layer 24 can be composed of discrete layers whose interfaces coincide with the interfaces that exist between the another dielectric material 20 and the MOL dielectric material 12.

By "nitrogen enriched diffusion barrier layer 28" it is meant that the exposed surfaces of U-shaped first diffusion barrier 16' have a higher nitrogen content therein after performing the nitridation process as compared to the originally deposited first diffusion barrier 16.

As stated above, the structure shown in FIG. 7 is formed by a nitridation process. In one embodiment, the nitridation process is a thermal nitridation process. When a thermal nitridation process is employed, no damage to the another dielectric material 20 and the MOL dielectric material 12 is observed. The thermal nitridation process that can be employed in the present disclosure does not include an electrical bias higher than 200 W. In some embodiments, no electrical bias is performed during the thermal nitridation process.

The thermal nitridation process employed in the present disclosure is performed in any nitrogen-containing ambient, which is not in the form of a plasma. The nitrogen-containing ambients that can be employed in the present disclosure include, but are not limited to, $N_2$, $NH_3$, $NH_4$, NO, and $NH_x$ wherein x is between 0 and 1. Mixtures of the aforementioned nitrogen-containing ambients can also be employed in the present disclosure. In some embodiments, the nitrogen-containing ambient is used neat, i.e., non-diluted. In other embodiments, the nitrogen-containing ambient can be diluted with an inert gas such as, for example, He, Ne, Ar and mixtures thereof. In some embodiments, $H_2$ can be used to dilute the nitrogen-containing ambient.

Notwithstanding whether the nitrogen-containing ambient is employed neat or diluted, the content of nitrogen within the nitrogen-containing ambient employed in the present disclosure is typically from 10% to 100%, with a nitrogen content within the nitrogen-containing ambient from 50% to 80% being more typical.

In one embodiment, the thermal nitridation process employed in the present disclosure is performed at a temperature from 50° C. to 450° C. In another embodiment, the thermal nitridation process employed in the present disclosure is performed at a temperature from 100° C. to 300° C.

In addition to a thermal nitridation process, a plasma nitridation process can be used in forming the structure shown in FIG. 7. When a plasma nitridation process is employed, an electrical bias of greater than 200 W can be employed. The plasma nitridation process can be performed by generating a plasma from one of the nitrogen-containing ambients that is mentioned above for the thermal nitridation process. In one embodiment, the plasma nitridation process employed in the present disclosure is performed at a temperature from 50° C. to 450° C. In another embodiment, the plasma nitridation process employed in the present disclosure is performed at a temperature from 100° C. to 300° C.

Notwithstanding the type of nitridation employed, the depth of the nitrided regions, i.e., the self-aligned tungsten nitride passivation layer 26, the nitrogen enriched dielectric surface layer 24, and the nitrogen enriched diffusion barrier layer 28 may vary. Typically, the depth of the nitrided regions, as measured from the outer most exposed surface inward, is from 0.5 nm to 20 nm, with a depth from 1 nm to 10 nm being more typical. Other depth ranges greater than or less than the depth ranges mentioned above are also possible in the present disclosure.

Figure 8:
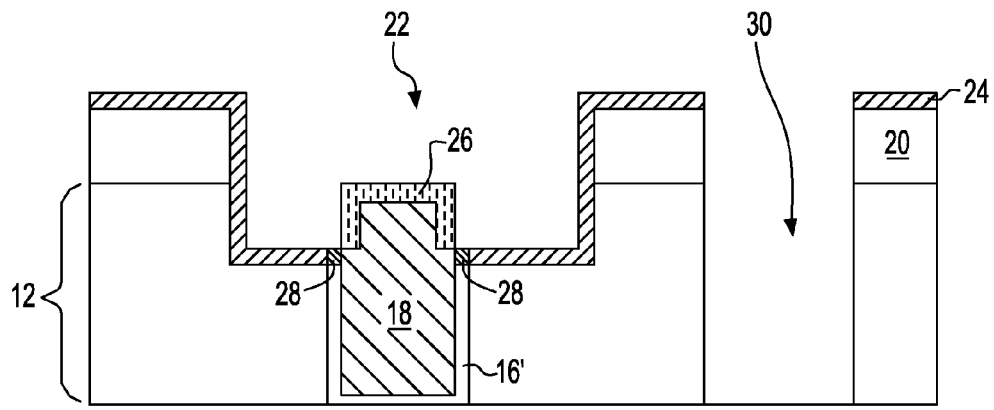
FIG. 8 is a pictorial representation (through a cross sectional view) illustrating the structure of FIG. 7 after forming a second interconnect pattern therein.

Referring now to FIG. 8, there is illustrated the structure of FIG. 7 after forming second interconnect pattern 30 therein. Specifically, and as shown in FIG. 8, the second interconnect pattern 30 is a via having a width that is within the range mentioned above for the contact via opening 14. The second interconnect pattern 30, which is formed adjacent to, but not in contact with, the first interconnect pattern 22, can be formed utilizing the technique mentioned above in forming the contact via opening 14. As shown in FIG. 8, the second interconnect pattern 30 extends entirely through the another dielectric material 20 and the MOL dielectric material 12. In some embodiments, the second interconnect pattern 30 can expose a diffusion region of a field effect transistor.

Figure 9:
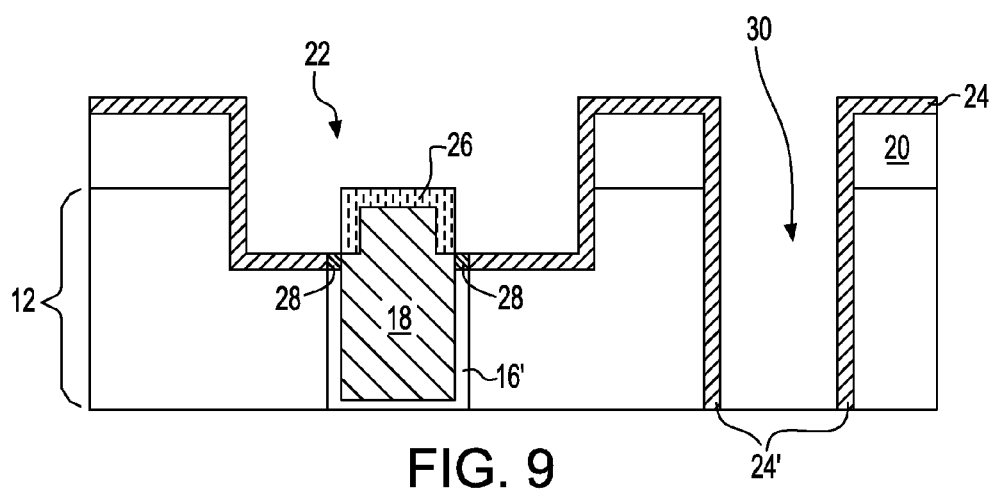
FIG. 9 is a pictorial representation (through a cross sectional view) illustrating the structure of FIG. 8 after performing an optional second nitridation process.

Referring now to FIG. 9, there is illustrated the structure of FIG. 8 after performing an optional second nitridation process. The optional second nitridation process forms a second nitrogen enriched dielectric surface layer 24' within the exposed surfaces of the another dielectric material 20 and the MOL dielectric 12 that are located within the second interconnect pattern 30. The optional second nitridation process can be performed utilizing either thermal nitridation or plasma nitridation as mentioned above. The characteristics and the depth of the optional second nitrogen enriched dielectric surface layer 24' are the same as mentioned above for nitrogen enriched dielectric surface layer 24.

Figure 10:
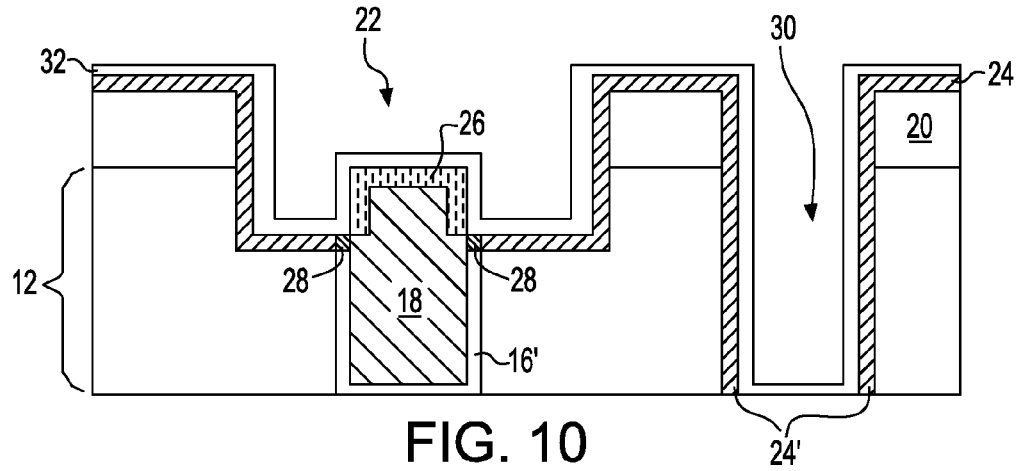
FIG. 10 is a pictorial representation (through a cross sectional view) illustrating the structure of FIG. 9 after forming a second diffusion barrier at least within the first and second interconnect patterns.

Referring now to FIG. 10, there is illustrated the structure of FIG. 9 after forming a second diffusion barrier 32 at least within the first and second interconnect patterns (22 and 30). Specifically, and as shown in FIG. 10, one portion of the second diffusion barrier 32 is located atop the nitrided surface layers within the first interconnect pattern 22, a second portion of the second diffusion barrier 32 is located atop the nitrogen enriched dielectric surface layer 24 that is located outside the first and second interconnect patterns (22, 30), and a third portion of the second diffusion barrier 32 is located within the second interconnect pattern 30 either atop the second nitrogen enriched dielectric surface layer 24' or atop non-nitrided surface layers of the another dielectric material 20 and the MOL dielectric material 12, if the optional second nitridation process is not performed.

The second diffusion barrier 32 can be composed of one of the diffusion barrier materials mentioned above for the first diffusion barrier 16. Also, the second diffusion barrier 32 can be made utilizing one of the processes mentioned above for the first diffusion barrier 16. Further, the second diffusion barrier 32 can have a thickness that is within the ranges mentioned above for the first diffusion barrier 16.

Figure 11A:
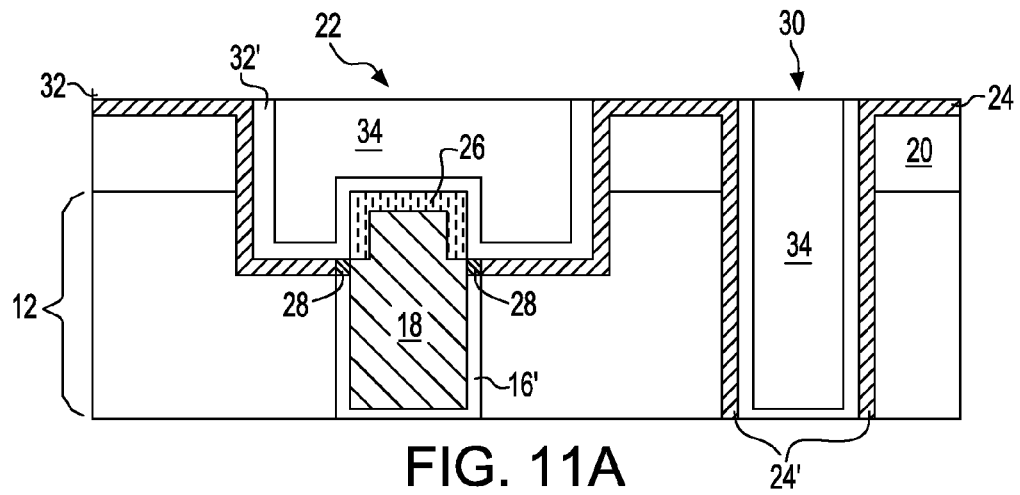
FIG. 11A is a pictorial representation (through a cross sectional view) illustrating the structure of FIG. 10 after forming a conductive material within the remaining portions of the first and second interconnect patterns and planarization in accordance with one embodiment of the present disclosure.
Figure 11B:
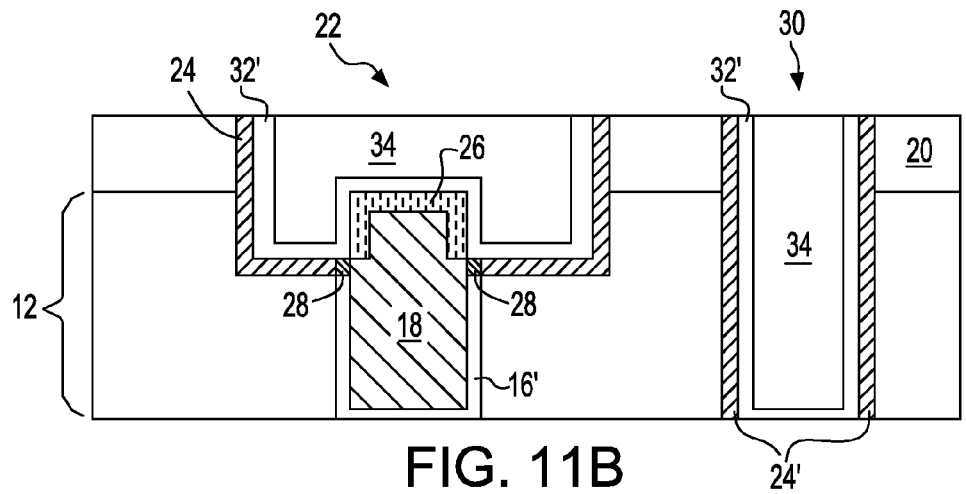
FIG. 11B is a pictorial representation (through a cross sectional view) illustrating the structure of FIG. 10 after forming a conductive material within the remaining portions of the first and second interconnect patterns and planarization in accordance with another embodiment of the present disclosure.

Referring now to FIG. 11A, there is illustrated the structure of FIG. 10 after forming a conductive material 34 within the remaining portions of the first and second interconnect patterns (22, 30) and planarization in accordance with one embodiment of the present disclosure. In this embodiment, the planarization process stops atop the nitrogen enriched dielectric surface 24 that is formed within the topmost horizontal surface of the another dielectric material 20. FIG. 11B illustrates another embodiment of the structure of FIG. 10 after forming a conductive material 34 within the remaining portions of the first and second interconnect patterns (22, 30) and planarization in accordance with one embodiment of the present disclosure. In this embodiment, the planarization process stops atop a non-nitrided horizontal surface of the another dielectric material 20.

Notwithstanding which embodiment is employed, the conductive material 34 that is formed may comprise polySi, SiGe, a conductive metal, an alloy comprising at least one conductive metal, a conductive metal silicide or combinations thereof. In one embodiment, the conductive material 34 is a conductive metal such as Cu, W or Al. In another embodiment, the conductive material 34 is Cu or a Cu alloy (such as Cu—Al). The conductive material 34 may be formed by a deposition process including chemical vapor deposition (CVD), plasma enhanced chemical vapor deposition (PECVD), sputtering, chemical solution deposition or plating that fills the first and second interconnect patterns from the bottom upwards can be used. In one embodiment, a bottom-up plating process is employed in forming the conductive material 34.

Following the deposition of the conductive material 34, a planarization process such as, for example, chemical mechanical polishing (CMP) and/or grinding, can be used to provide the structures shown in FIGS. 11A and 11B.

In some embodiments, especially when Cu or a Cu alloy is employed as the conductive material 34, an optional plating seed layer (not shown) can be formed prior to forming the conductive material. The optional plating seed layer is employed to selectively promote subsequent electroplating of a pre-selected conductive metal or metal alloy. The optional plating seed layer may comprise Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional seed layer may vary depending on the material of the optional plating seed layer as well as the technique used in forming the same. Typically, the optional plating seed layer has a thickness from 2 to 80 nm. The optional plating seed layer can be formed by a conventional deposition process including, for example, CVD, PECVD, ALD, and PVD.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor structure comprising:
   forming a tungsten region within a middle-of-the-line (MOL) dielectric material, said tungsten region having a topmost surface that is coplanar with an upper surface of the MOL dielectric material;
   forming another dielectric material atop the MOL dielectric and the tungsten region;
   forming a first interconnect pattern into one portion of the another dielectric material and the MOL dielectric material, wherein upper sidewall portions of the tungsten region are exposed;
   performing a nitridation process providing a self-aligned tungsten nitride passivation layer within the topmost surface and upper sidewall portions of the tungsten region, and a nitrogen enriched dielectric surface within exposed surfaces of both the another dielectric material and the MOL dielectric material;
   forming a second interconnect pattern into another portion of the another dielectric material and the MOL dielectric material; and
   filling remaining portions of the first interconnect pattern and second interconnect pattern with at least a conductive material.

2. The method of claim 1, further comprising performing another nitridation process providing a second nitrogen enriched dielectric surface layer within the exposed sidewalls of both the another dielectric material and the MOL dielectric material that are located within the second interconnect pattern.

3. The method of claim 1, wherein said nitridation process comprises a thermal nitridation process.

4. The method of claim 3, wherein said thermal nitridation process is performed at a temperature from 50° C. to 450° C.

5. The method of claim 3, wherein said thermal nitridation is performed in a nitrogen-containing ambient, said nitrogen-containing ambient is selected from the group consisting of $N_2$, $NH_3$, $NH_4$, NO, and $NH_x$ wherein x is between 0-1.

6. The method of claim 3, wherein said nitridation process comprises a plasma nitridation process.

7. The method of claim 6, wherein said plasma nitridation process is performed at a temperature from 50° C. to 450° C.

8. The method of claim 6, wherein said plasma nitridation process includes generating a plasma from a nitrogen-containing ambient, said nitrogen-containing ambient is selected from the group consisting of $N_2$, $NH_3$, $NH_4$, NO, and $NH_x$ wherein x is between 0-1.

9. The method of claim 2, wherein said another nitridation process includes comprises another thermal nitridation process.

10. The method of claim 9, wherein said another thermal nitridation process is performed at a temperature from 50° C. to 450° C.

11. The method of claim 9, wherein said another thermal nitridation is performed in a nitrogen-containing ambient, said nitrogen-containing ambient is selected from the group consisting of $N_2$, $NH_3$, $NH_4$, NO, and $NH_x$ wherein x is between 0-1.

12. The method of claim 2, wherein said another nitridation process comprises another plasma nitridation process.

13. The method of claim 12, wherein said another plasma nitridation process is performed at a temperature from 50° C. to 450° C.

14. The method of claim 12, wherein said another plasma nitridation process includes generating a plasma from a nitrogen-containing ambient, said nitrogen-containing ambient is selected from the group consisting of $N_2$, $NH_3$, $NH_4$, NO, and $NH_x$ wherein x is between 0-1.

15. The method of claim 1, wherein an U-shaped first diffusion barrier is located between a portion of the MOL dielectric material and the tungsten region, and wherein a nitrogen enriched diffusion barrier is formed atop the U-shaped first diffusion barrier during the nitridation process.

16. The method of claim 15, wherein said nitrogen enriched diffusion barrier is positioned between an end portion of the nitrogen enriched dielectric surface layer and a sidewall of the tungsten region.

17. The method of claim 1, wherein said first interconnect pattern is a line, and said second interconnect pattern is a via.

* * * * *